(12) United States Patent
Yamashita

(10) Patent No.: US 11,373,982 B2
(45) Date of Patent: Jun. 28, 2022

(54) SEMICONDUCTOR DEVICE

(71) Applicant: Kioxia Corporation, Tokyo (JP)

(72) Inventor: Shinji Yamashita, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/116,046

(22) Filed: Dec. 9, 2020

(65) Prior Publication Data

US 2022/0059502 A1 Feb. 24, 2022

(30) Foreign Application Priority Data

Aug. 24, 2020 (JP) .............................. JP2020-141124

(51) Int. Cl.
| | | |
|---|---|---|
| *H01L 25/065* | (2006.01) | |
| *H01L 23/538* | (2006.01) | |
| *H01L 23/04* | (2006.01) | |
| *H01L 23/31* | (2006.01) | |

(52) U.S. Cl.
CPC .......... *H01L 25/0657* (2013.01); *H01L 23/04* (2013.01); *H01L 23/31* (2013.01); *H01L 23/5385* (2013.01); *H01L 23/5386* (2013.01)

(58) Field of Classification Search
CPC ..... H01L 25/0657; H01L 23/04; H01L 23/31; H01L 23/5385; H01L 23/5386
See application file for complete search history.

(56) References Cited

U.S. PATENT DOCUMENTS

| 10,658,305 | B2 | 5/2020 | Seto | |
|---|---|---|---|---|
| 10,971,473 | B2 | 4/2021 | Kosaka | |
| 2003/0087507 | A1* | 5/2003 | Jiang | H01L 24/32 438/460 |
| 2016/0005696 | A1* | 1/2016 | Tomohiro | H01L 23/544 257/777 |
| 2021/0296256 | A1 | 9/2021 | Bando et al. | |

FOREIGN PATENT DOCUMENTS

| JP | 2010-080651 A | 4/2010 |
|---|---|---|
| JP | 2018-056539 A | 4/2018 |
| JP | 2019-134020 A | 8/2019 |
| JP | 2021-150396 A | 9/2021 |
| TW | 202011546 A | 3/2020 |
| TW | 202011562 A | 3/2020 |

* cited by examiner

*Primary Examiner* — Peniel M Gumedzoe

(74) *Attorney, Agent, or Firm* — Oblon, McClelland, Maier & Neustadt, L.L.P.

(57) ABSTRACT

A semiconductor device according to the present embodiment includes a wiring substrate having a wiring layer. A first semiconductor chip is provided above the wiring substrate. A metallic wire connects the first semiconductor chip and the wiring substrate to each other. A silicon chip is provided above the first semiconductor chip and covers above the metallic wire. A resin layer seals the first semiconductor chip and the silicon chip, and the metallic wire. The silicon chip is insulated from the wiring substrate.

17 Claims, 17 Drawing Sheets

SEMICONDUCTOR DEVICE

CROSS REFERENCE TO RELATED APPLICATIONS

This application is based upon and claims the benefit of priority from the prior Japanese Patent Application No. 2020-141124, filed on Aug. 24, 2020, the entire contents of which are incorporated herein by reference.

FIELD

The embodiments of the present invention relate to a semiconductor device.

BACKGROUND

A semiconductor package is configured by sealing a semiconductor chip mounted on a wiring substrate with a resin material. In recent years, semiconductor packages have been increasingly downscaled and thinned and the film thickness of the resin material on the semiconductor chip has become thinner.

Meanwhile, to identify products, characters are engraved on the surface of the resin material of the semiconductor package by a laser marking technique. The laser marking damages the resin material to a certain depth from the surface of the resin material depending on the laser intensity. If the thickness of the resin material is too small, the semiconductor chip and bonding wires have a risk of being damaged.

DETAILED DESCRIPTION

Figure 1:
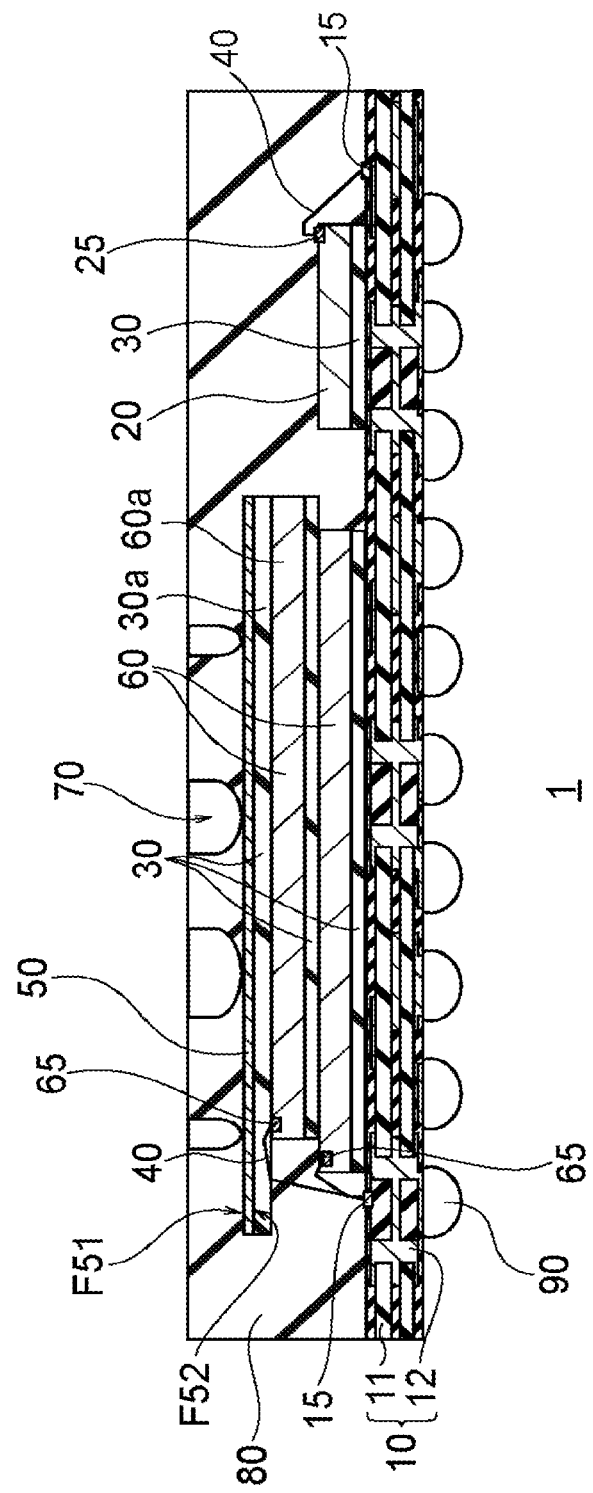
FIG. 1 is a sectional view illustrating a configuration example of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a substrate on which semiconductor chips are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a wiring substrate having a wiring layer. A first semiconductor chip is provided above the wiring substrate. A metallic wire connects the first semiconductor chip and the wiring substrate to each other. A silicon chip is provided above the first semiconductor chip and covers above the metallic wire. A resin layer seals the first semiconductor chip and the silicon chip, and the metallic wire. The silicon chip is insulated from the wiring substrate.

First Embodiment

Figure 2:
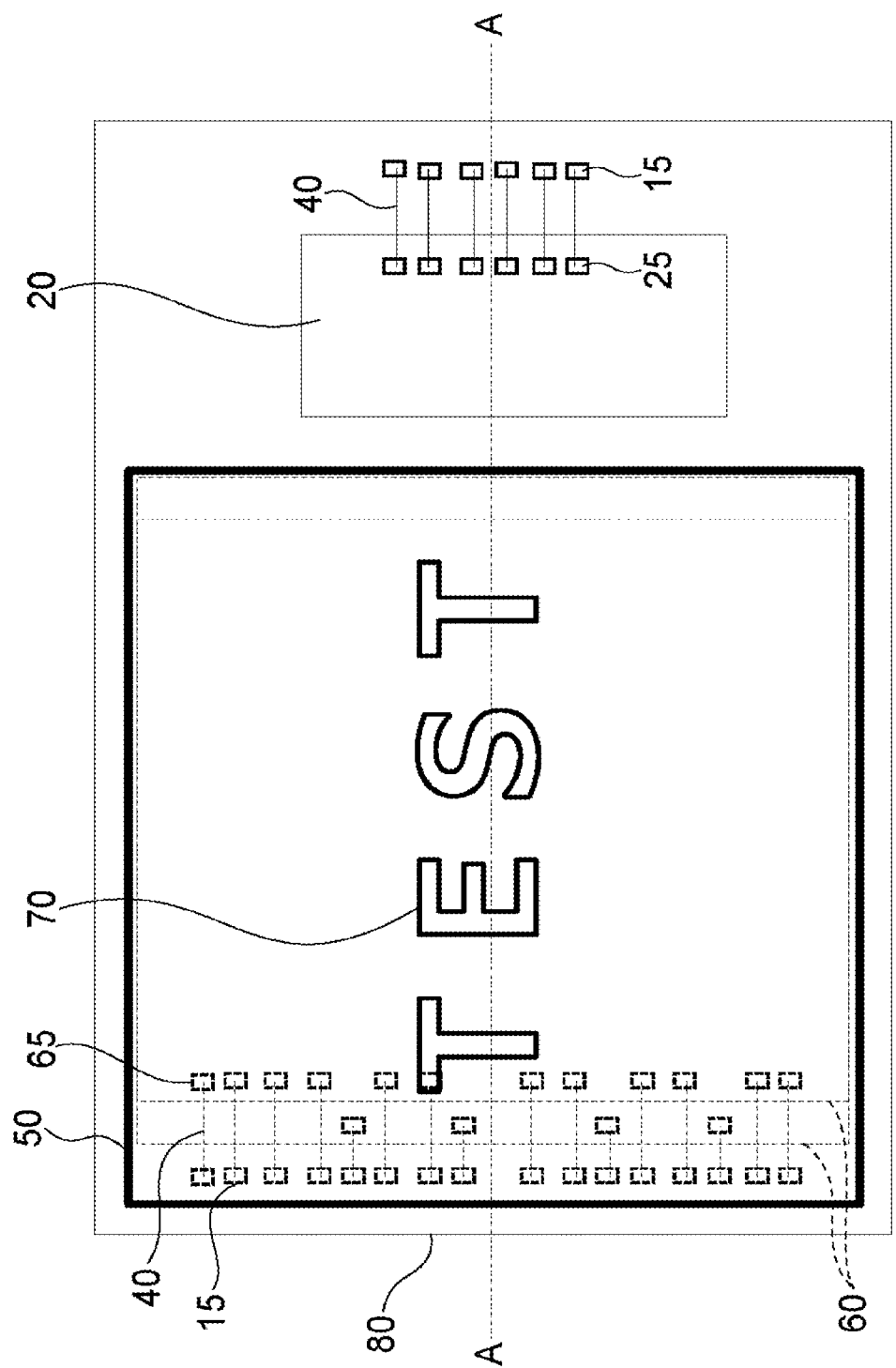
FIG. 2 is a plan view illustrating the configuration example of the semiconductor device according to the first embodiment.

FIG. 1 is a sectional view illustrating a configuration example of a semiconductor device 1 according to a first embodiment. FIG. 2 is a plan view illustrating the configuration example of the semiconductor device 1 according to the first embodiment. FIG. 1 illustrates a cross-section along a line A-A in FIG. 2.

The semiconductor device 1 includes a wiring substrate 10, a controller chip 20, adhesive layers 30, metallic wires 40, a dummy chip 50, memory chips 60, a resin layer 80, and metallic bumps 90.

The semiconductor device 1 is, for example, a semiconductor package in which the memory chips 60 and the controller chip 20 are mounted on the wiring substrate 10 and are sealed with the resin layer 80. The semiconductor package may be, for example, a BGA (Ball Grid Array) or an LGA (Land Grid Array).

The wiring substrate 10 is configured by stacking a plurality of resin layers 11 and a plurality of wiring layers 12. For example, a glass material and a resin material are used as the resin layers 11 being organic material layers. For example, the resin layers 11 may be glass epoxy resin, which is glass fiber containing epoxy resin. For example, a low-resistance metal such as copper or tungsten is used as the wiring layers 12.

A plurality of electrode pads 15 that are respectively electrically connected to any of the wiring layers 12 are provided on the wiring substrate 10. The metallic wires 40 are bonded to the electrode pads 15, respectively. The electrode pads 15 are electrically connected to any of a plurality of electrode pads 65 provided on the memory chips 60 or a plurality of electrode pads 25 provided on the controller chip 20 via the metallic wires 40, respectively.

The memory chips 60 are, for example, semiconductor chips on which a NAND flash memory is mounted. The controller chip 20 is, for example, a semiconductor chip that controls the memory chips 60. The memory chips 60 and the controller chip 20 are mounted on the same wiring substrate 10 and are sealed by the resin layer 80. The semiconductor device 1 is thereby configured as one semiconductor package. A single memory chip 60 may be mounted on the wiring substrate 10, or a plurality of memory chips 60 may be stacked on the wiring substrate 10. Other semiconductor chips may be further mounted on the wiring substrate 10. The semiconductor device 1 may be a different LSI (Large-Scale Integrated circuit) other than the memory.

The electrode pads 65 are respectively electrically connected to any of a plurality of semiconductor elements provided in the memory chips 60. The metallic wires 40 are respectively bonded to the electrode pads 65. The electrode pads 65 and the electrode pads 15 are electrically connected to each other via the metallic wires 40, respectively.

The electrode pads 25 are respectively electrically connected to any of a plurality of semiconductor elements provided in the controller chip 20. The metallic wires 40 are respectively bonded to the electrode pads 25. The electrode pads 25 and the electrode pads 15 are electrically connected to each other via the metallic wires 40, respectively. In this way, the metallic wires 40 are connected between the memory chips 60 and the wiring substrate 10 and between the controller chip 20 and the wiring substrate 10 and electrically connect the memory chips 60 and the wiring substrate 10 to each other and the controller chip 20 and the wiring substrate 10 to each other, respectively. For example, a low-resistance metal such as gold is used as the metallic wires 40.

The controller chip 20 and the memory chips 60 are stuck onto the wiring substrate 10 by the associated adhesive layers 30. In the present embodiment, the controller chip 20 is not arranged on the memory chips 60 and is directly stuck onto the wiring substrate 10 with the adhesive layer 30. The controller chip 20 and the memory chips 60 are respectively electrically connected to any of the wiring layers 12 of the wiring substrate 10 via the associated metallic wires 40.

The dummy chip 50 is placed on a topmost memory chip 60 (hereinafter, also "memory chip 60a") among the stacked memory chips 60. The dummy chip 50 does not contribute to electrical operations such as data write and read operations. The dummy chip 50 is, for example, a semiconductor chip including no semiconductor element. The dummy chip 50 may be a semiconductor chip of a same material as that of semiconductor substrates that constitute the memory chips 60 and the controller chip 20. The dummy chip 50 is, for example, a silicon chip formed of a silicon substrate.

Figure 3A:
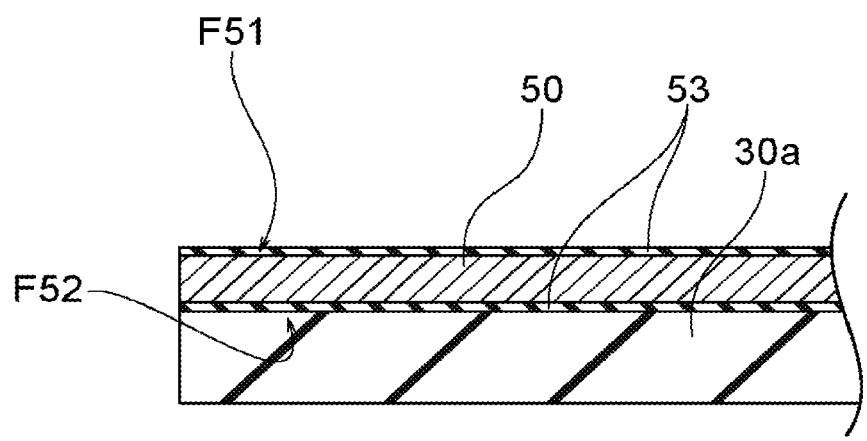
FIG. 3A is a sectional view illustrating a configuration example of a part of a dummy chip and an adhesive layer.

The dummy chip 50 includes a front surface F51, and a back surface F52 on the opposite side to the front surface F51. The dummy chip 50 is stuck to the surface of the memory chip 60a with an adhesive layer 30 (hereinafter, also "adhesive layer 30a") on the back surface F52. As illustrated in FIG. 3A described later, a silicon dioxide film (a natural oxide film) 53 is provided on the front surface F51 and the back surface F52 of the dummy chip 50. The adhesive layer 30a is placed between the silicon dioxide film 53 on the back surface F52 and the memory chip 60a. Meanwhile, the resin layer 80 is provided on the front surface F51 of the dummy chip 50. Concave portions 70 are formed on the surface of the resin layer 80 using the laser marking method, or the like. The concave portions 70 form characters in a planar view where a package of the semiconductor device 1 is viewed from above the front surface F51 of the dummy chip 50 (in the stacking direction of the memory chips 60 and the dummy chip 50) as illustrated in FIG. 2. It suffices that the engraved characters are those to be used as an identifier of the product and the engraved characters are not particularly limited to any characters. In this way, the surface of the resin layer 80 includes engraved characters.

It suffices that the dummy chip 50 has a thickness that can protect the memory chips 60 and the metallic wires 40 from damages of the laser marking. Therefore, the thickness of the dummy chip 50 can be smaller than the thicknesses of the memory chips 60 and the controller chip 20. For example, while the thicknesses of the memory chips 60 and the controller chip 20 are about 30 micrometers, the thickness of the dummy chip 50 is about 25 micrometers. The dummy chip 50 is obtained, for example, by thinning a silicon wafer by a CMP (Chemical Mechanical Polishing) method, or the like and singulating the thinned silicon wafer into a predetermined size by a blade dicing method or a laser dicing method. The singulated dummy chip 50 is exposed to the atmosphere and the natural oxide film (silicon dioxide film) 53 is formed on the front surface F51 and the back surface F52.

The dummy chip 50 covers the entire surface of the memory chip 60a and protrudes from the top surface of the memory chip 60a to above the metallic wires 40 in the manner of eaves as illustrated in FIGS. 1 and 2. That is, the metallic wires 40 is located between the wiring substrate 10 and the dummy chip 50. The dummy chip 50 is provided above the memory chip 60a, the metallic wires 40 connected to the memory chip 60a, and the electrode pads 15 of the wiring substrate 10. The reason will be described later.

The dummy chip 50 protrudes at least from an end portion of the memory chip 60a connected to the metallic wires 40. For example, in a case in which the metallic wires 40 are connected to both ends of the memory chip 60a, the dummy chip 50 is provided to protrude from the both ends of the memory chip 60a although not illustrated. In a case in which the metallic wires 40 are connected to all the four sides of the memory chips 60a, the dummy chip 50 is provided to protrude from all the four sides of the memory chip 60a. In the present embodiment, the memory chip 60a and the dummy chip 50 are assumed to have substantially rectangular shapes or substantially square shapes. However, the memory chip 60a and the dummy chip 50 may have other quadrangular shapes or polygonal shapes. However, it is preferable that the dummy chip 50 have a quadrangular shape or a polygonal shape having same numbers of sides and angles as those of the memory chip 60a to cover the topmost memory chip 60a in the planar view.

The adhesive layers 30 are used to stick the memory chips 60 and the controller chip 20 to the wiring substrate 10 and to stack the memory chips 60. The adhesive layer 30a is used to stick the dummy chip 50 onto the topmost memory chip 60a. The adhesive layer 30a sticks the memory chip 60a and the dummy chip 50 to each other on the back surface F52 of the dummy chip 50. For example, an insulating resin material such as a DAF (Die Attachment Film) is used as the adhesive layers 30.

The resin layer 80 seals the memory chips 60, the controller chip 20, the metallic wires 40, and the dummy chip 50. Accordingly, the resin layer 80 protects the memory chips 60, the controller chip 20, the metallic wires 40, and the dummy chip 50. The thickness of the resin layer 80 on the dummy chip 50 is, for example, equal to or less than 50 micrometers.

The metallic bumps 90 are provided on the back surface of the wiring substrate 10. The metallic bumps 90 are respectively connected to any of the wiring layers 12 and are electrically connected to the memory chips 60 or the control chip 20 via the wiring substrate 10 and the metallic wires 40. For example, a low-resistance metal such as solder is used as the metallic bumps 90.

As described above, in the semiconductor device 1 according to the present embodiment, the dummy chip 50 covers the entire surface of the topmost memory chip 60a and protrudes from the end portions of the memory chip 60a to be also arranged above the metallic wires 40. Accordingly, damages on the memory chip 60a and the metallic wires 40 caused by the laser marking at the time of formation of the concave portions 70 can be suppressed.

As illustrated in FIG. 2, the dummy chip 50 extends to the electrode pads 15 of the wiring substrate 10 in a planar view viewed from above the front surface F51 of the dummy chip 50 (in the stacking direction of the memory chips 60 and the dummy chip 50) and covers all the memory chip 60a, the metallic wires 40, and the electrode pads 65 and 15. That is, the dummy chip 50 covers the metallic wires 40, the electrode pads 65 and 15 as well as the memory chip 60a in the planar view viewed from above the front surface F51 of the dummy chip 50. In this way, due to being provided above the metallic wires 40 and the electrode pads 65 and 15, the dummy chip 50 can suppress damages on the metallic wires 40 and the electrode pads 65 and 15 as well as on the memory chip 60a caused by the laser marking at the formation of the concave portions 70. As a result, the reliability of the semiconductor device 1 can be enhanced.

Since being smaller than that of each of the memory chips 60, the thickness of the dummy chip 50 does not increase the thickness of the entire package of the semiconductor device 1 so much. Meanwhile, the laser marking can be performed with the memory chips 60 hardly damaged even when the resin layer 80 is decreased in the thickness due to provision of the dummy chip 50. That is, since being harder than the resin layer 80, the dummy chip 50 can protect the memory chip 60a and the like from the laser marking even when it is thin. Therefore, the thickness of the package of the semiconductor device 1 as a whole can be reduced.

The dummy chip 50 can also restrain the peaks of loops of the metallic wires 40 to decrease the height of the metallic wires 40. In this instance, the dummy chip 50 is stuck to the memory chip 60a on the back surface F52 by the insulating adhesive layer 30a. Therefore, even when the metallic wires 40 are brought in contact with the adhesive layer 30a, the metallic wires 40 and the dummy chip 50 can maintain the electrically insulated state. Further, the silicon dioxide film 53 is formed on the front surface F51 and the back surface F52 of the dummy chip 50. FIG. 3A is a sectional view illustrating a configuration example of a part of the dummy chip 50 and the adhesive layer 30a. The silicon dioxide film (natural oxide film) 53 is provided on the front surface F51 and the back surface F52 of the dummy chip 50. Therefore, even when the metallic wires 40 pass through the adhesive layer 30a to be in contact with the dummy chip 50, the silicon dioxide film 53 can maintain the electrically insulated state between the dummy chip 50 and the metallic wires 40. This can suppress electrical short-circuiting of the metallic wires 40 with other components via the dummy chip 50.

The dummy chip 50 may be caused to function as a heat spreader. With provision of the dummy chip 50, the effect of suppressing warpage of the package of the semiconductor device 1 can be also obtained. To increase the effects of the heat spreader and the warpage suppression, it is preferable that the planar shape of the dummy chip 50 and the size thereof be close to the planar shape and the size of the package of the semiconductor device 1.

Figure 3B:
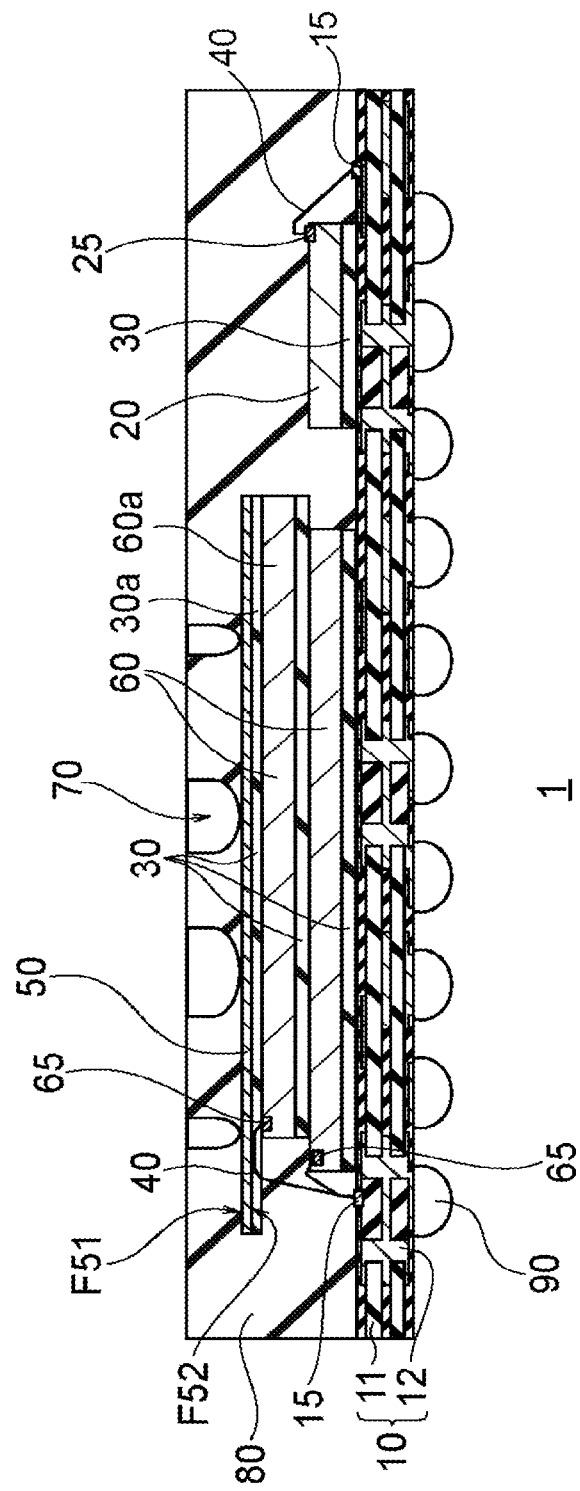
FIG. 3B is a sectional view illustrating a configuration example of a semiconductor device according to a modification of the first embodiment.

FIG. 3B is a sectional view illustrating a configuration example of a semiconductor device according to a modification of the first embodiment. In this modification, the metallic wires 40 are in contact with the dummy chip 50. Also when the metallic wires 40 pass through the adhesive layer 30a to be in contact with the dummy chip 50 in this way, the silicon dioxide film 53 can maintain the electrically insulated state between the dummy chip 50 and the metallic wires 40 as illustrated in FIG. 3A. This can suppress electrical short-circuiting of the metallic wires 40 with other components via the dummy chip 50. Since the metallic wires 40 can be in contact with the dummy chip 50, the thickness of the adhesive layer 30a in the stacking direction of the memory chips 60 and the dummy chip 50 can be reduced. Accordingly, the thickness of the package of the semiconductor device 1 can be reduced more.

A manufacturing method of the semiconductor device according to the present embodiment is explained next.

Figure 4:
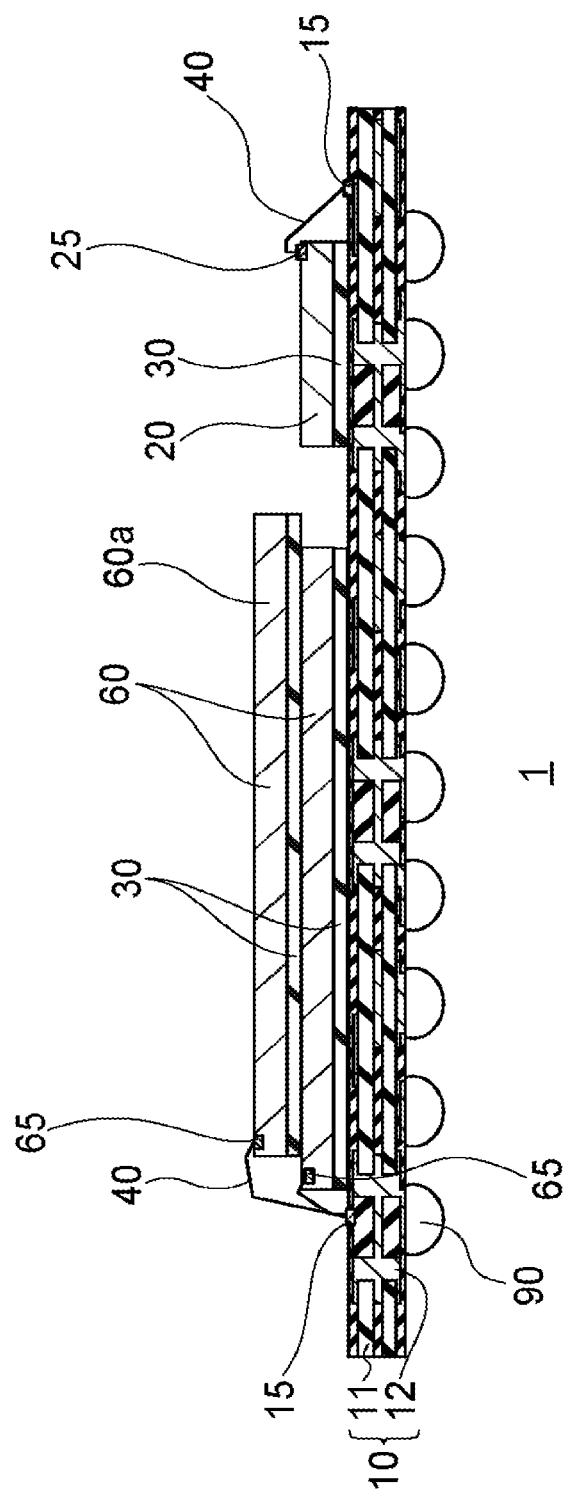
FIG. 4 is a sectional view illustrating an example of a manufacturing method of the semiconductor device according to the first embodiment.
Figure 5:
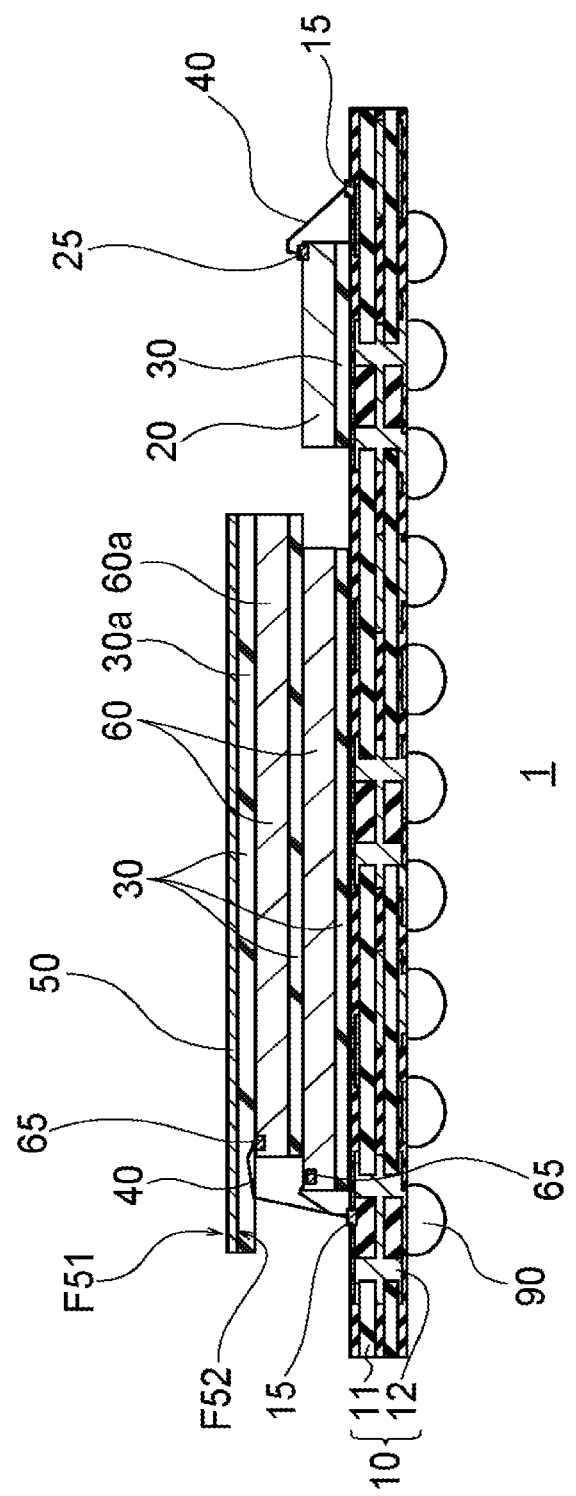
FIG. 5 is a sectional view illustrating an example of the manufacturing method of the semiconductor device following FIG. 4.
Figure 6:
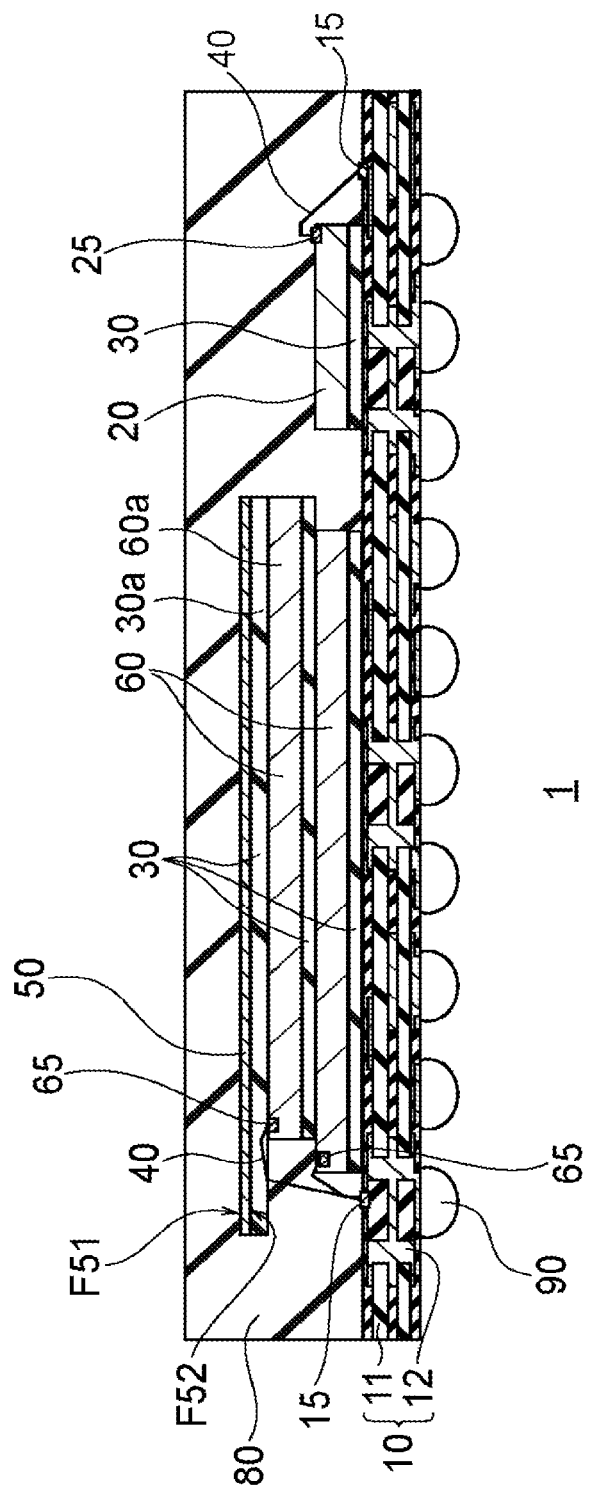
FIG. 6 is a sectional view illustrating an example of the manufacturing method of the semiconductor device following FIG. 5.

FIGS. 4 to 6 are sectional views illustrating an example of the manufacturing method of the semiconductor device according to the first embodiment.

First, semiconductor elements are formed on a semiconductor substrate in the form of a wafer using a semiconductor manufacturing process. The semiconductor substrate is, for example, a silicon substrate. In a case of forming the memory chips 60, the semiconductor elements may be, for example, memory cell arrays of a NAND flash memory and the like although not illustrated. In a case of forming the controller chips 20, the semiconductor elements may be, for example, transistors, capacitor elements, resistance elements, and the like.

Next, the semiconductor substrate in the form of a wafer is singulated into the memory chips 60 or the controller chips 20 using the blade dicing method or the laser dicing method although not illustrated. The memory chips 60 or the controller chips 20 are thereby completed.

Meanwhile, another semiconductor substrate in the form of a wafer is thinned and is diced with no semiconductor element formed thereon. The dummy chips 50 are thereby formed. The dummy chips 50 are exposed to the atmosphere after being singulated. The silicon dioxide film (natural oxide film) 53 is thereby formed on the front surface F51 and the back surface F52 of each of the dummy chips 50.

Next, the adhesive layer 30 is attached to the back surface of the controller chip 20 and the controller chip 20 is attached onto the wiring substrate 10 as illustrated in FIG. 4. The adhesive layer 30 is also attached to the back surface of the memory chip 60 to attach the memory chip 60 onto the wiring substrate 10. While a single memory chip 60 may be attached onto the wiring substrate 10, a plurality of memory chips 60 may be stacked on the wiring substrate 10. In this case, the memory chips 60 are stuck to each other with the associated adhesive layers 30. The number of stacked memory chips 60 is not particularly limited to any number.

Next, the electrode pads 25 on the top surface of the controller chip 20 and the electrode pads 15 on the top surface of the wiring substrate 10, and the electrode pads 65 on the top surface of the memory chips 60 and the electrode pads 15 on the top surface of the wiring substrate 10 are connected to each other with the metallic wires 40, respectively. At this time, the metallic wires 40 curve in the manner of a loop and the apexes thereof are at positions higher than the topmost memory chip 60a.

Next, as illustrated in FIG. 5, the adhesive layer 30a is attached to the back surface F52 of the dummy chip 50 to attach the dummy chip 50 onto the topmost memory chip 60a. At this time, the dummy chip 50 is attached so as to be arranged above the top surface of the topmost memory chip 60a and the metallic wires 40. The loops of the metallic wires 40 are restrained to be lower by the dummy chip 50. At this time, the metal wire 40 contacts with the adhesive layer 30a. Alternatively, a part of the metal wire 40 is covered with the adhesive layer 30a and contacts with the silicon oxide film 53 of the dummy chip 50. The metallic wires 40 are in contact with the adhesive layer 30a or are embedded in the adhesive layer 30a to be in contact with the silicon dioxide film 53 of the dummy chip 50. Therefore, adjacent ones of the metallic wires 40 are not short-circuited with each other.

Meanwhile, the controller chip 20 is stuck onto the wiring substrate 10 with the adhesive layer 30.

Next, the controller chip 20, the dummy chip 50, the memory chips 60, and the metallic wires 40 are sealed with the resin layer 80 as illustrated in FIG. 6. Accordingly, the resin layer 80 can cover and protect the controller chip 20, the dummy chip 50, the memory chips 60, and the metallic wires 40. The thickness of the resin layer 80 on the dummy chip 50 is equal to or less than 50 micrometers.

Next, the concave portions 70 are formed on the surface of the resin layer 80 by the laser marking method to engrave an identifier of the product as illustrated in FIG. 1. At this time, the topmost memory chip 60a and the metallic wires 40 are protected by the dummy chip 50. Therefore, damages caused by the laser marking hardly reach the memory chips 60 and the metallic wires 40.

Thereafter, the wiring substrate 10 is diced by the blade dicing method or the laser dicing method to singulate the semiconductor devices 1. Packages of the semiconductor device 1 illustrated in FIG. 1 are thereby completed.

According to the present embodiment, the dummy chip 50 covers the entire surface of the topmost memory chip 60a and is also arranged above the metallic wires 40 connected to the topmost memory chip 60a at the time of laser marking. Therefore, damages on the memory chip 60a and the metallic wires 40 caused by the laser marking can be suppressed.

The dummy chip 50 can restrain the apexes of the loops of the metallic wires 40 to lower the heights of the metallic wires 40. The insulating silicon dioxide film 53 and the insulating adhesive layer 30a are provided on the back surface F52 of the dummy chip 50. Therefore, even if the metallic wires 40 are brought in contact with the silicon dioxide film 53 or the adhesive layer 30a, the metallic wires 40 and the dummy chip 50 can maintain an electrically insulated state. Further, short-circuiting of adjacent ones of the metallic wires 40 can be suppressed.

The dummy chip 50 may be caused to function as a heat spreader. With provision of the dummy chip 50, the effect of suppressing warpage of the package of the semiconductor device 1 is also be obtained.

First Modification

Figure 7:
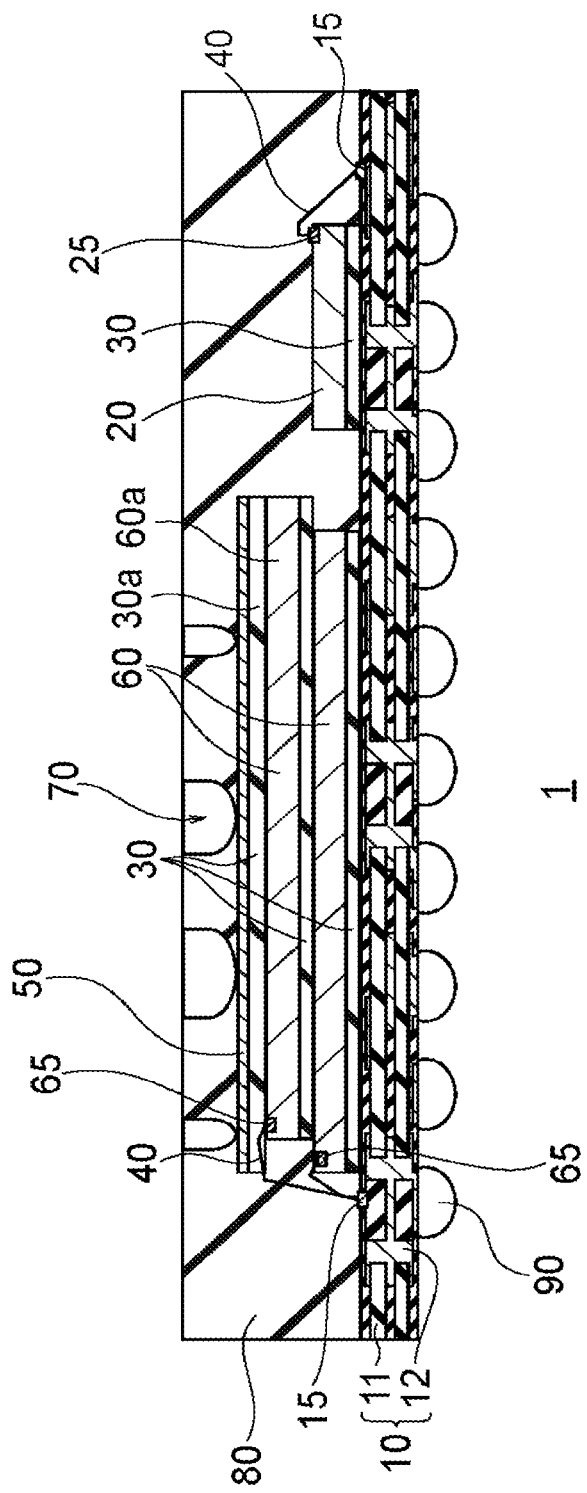
FIG. 7 is a sectional view illustrating a configuration example of a semiconductor device according to a first modification of the first embodiment.
Figure 8:
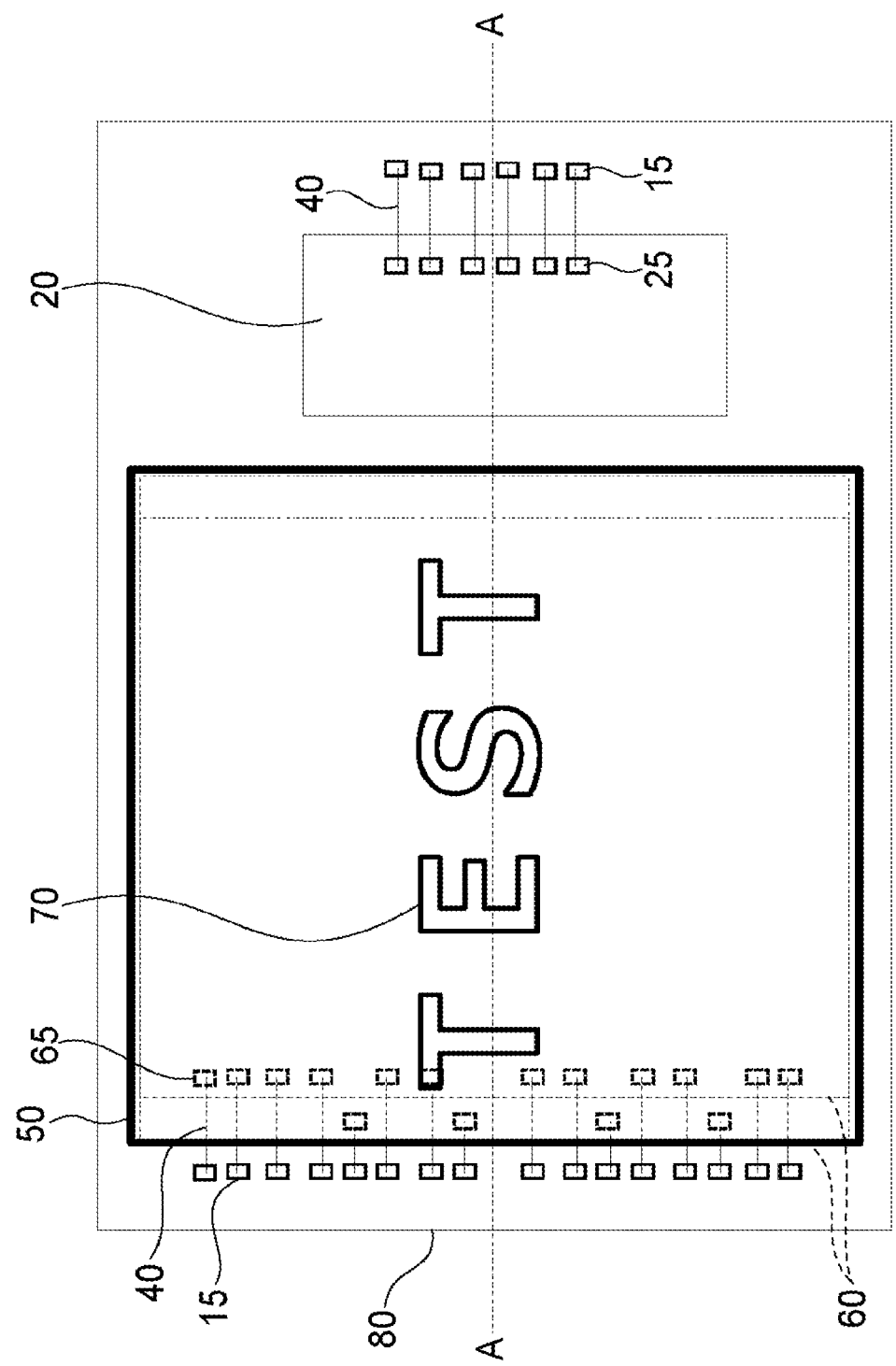
FIG. 8 is a plan view illustrating the configuration example of the semiconductor device according to the first modification of the first embodiment.

FIG. 7 is a sectional view illustrating a configuration example of the semiconductor device 1 according to a first modification of the first embodiment. FIG. 8 is a plan view illustrating the configuration example of the semiconductor device 1 according to the first modification of the first embodiment. The electrode pads 15 are provided on the wiring substrate 10 and are arranged at a position lower than the electrode pads 65 of the topmost memory chip 60a. It is therefore considered that the electrode pads 15 are sufficiently protected by the resin layer 80. Accordingly, the dummy chip 50 does not necessarily need to cover the electrode pads 15. For example, the dummy chip 50 is not provided above the electrode pads 15 of the wiring substrate 10 in the present modification. Meanwhile, the dummy chip 50 is provided above the apexes of the loops of the metallic wires 40 and the electrode pads 65 of the memory chip 60a. That is, the dummy chip 50 covers the topmost memory chip 60a, the apexes of the loops of the metallic wires 40, and the electrode pads 65 on the memory chip 60a in a planar view viewed from above the front surface F51. Also in this modification, the dummy chip 50 can suppress damages on the metallic wires 40 and the electrode pads 65 caused by the laser marking.

Second Modification

Figure 9:
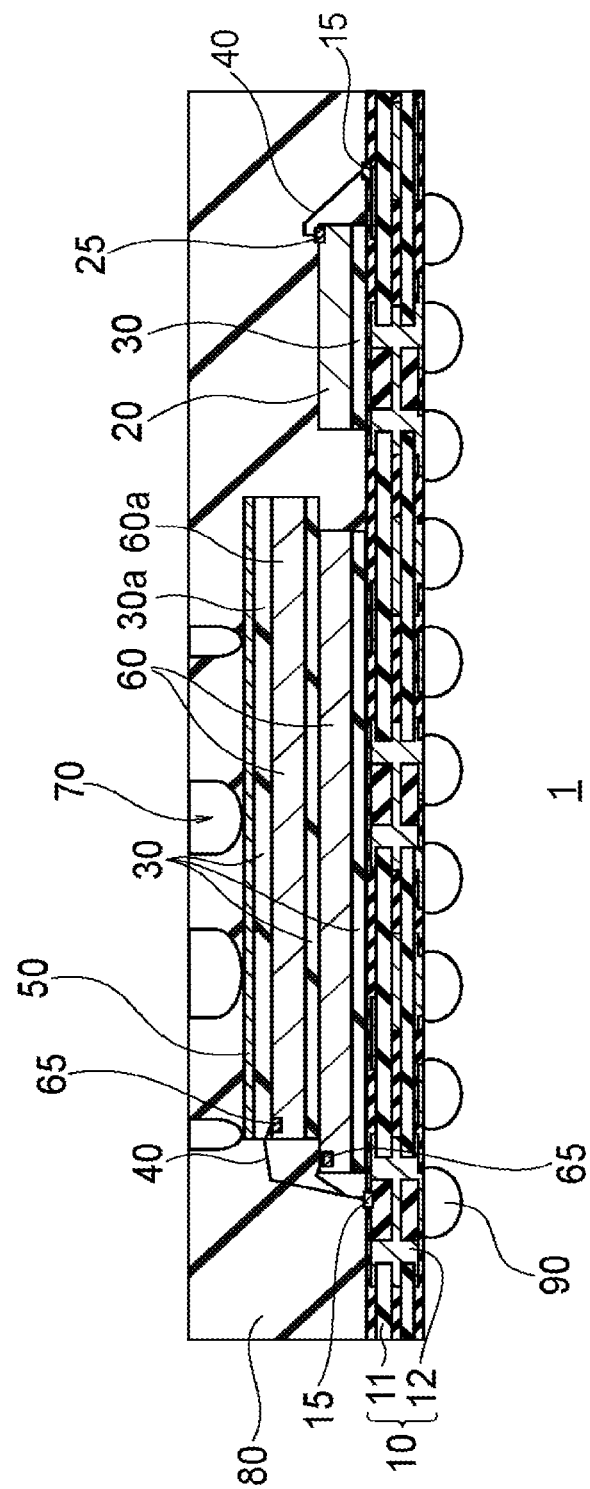
FIG. 9 is a sectional view illustrating a configuration example of a semiconductor device according to a second modification of the first embodiment.
Figure 10:
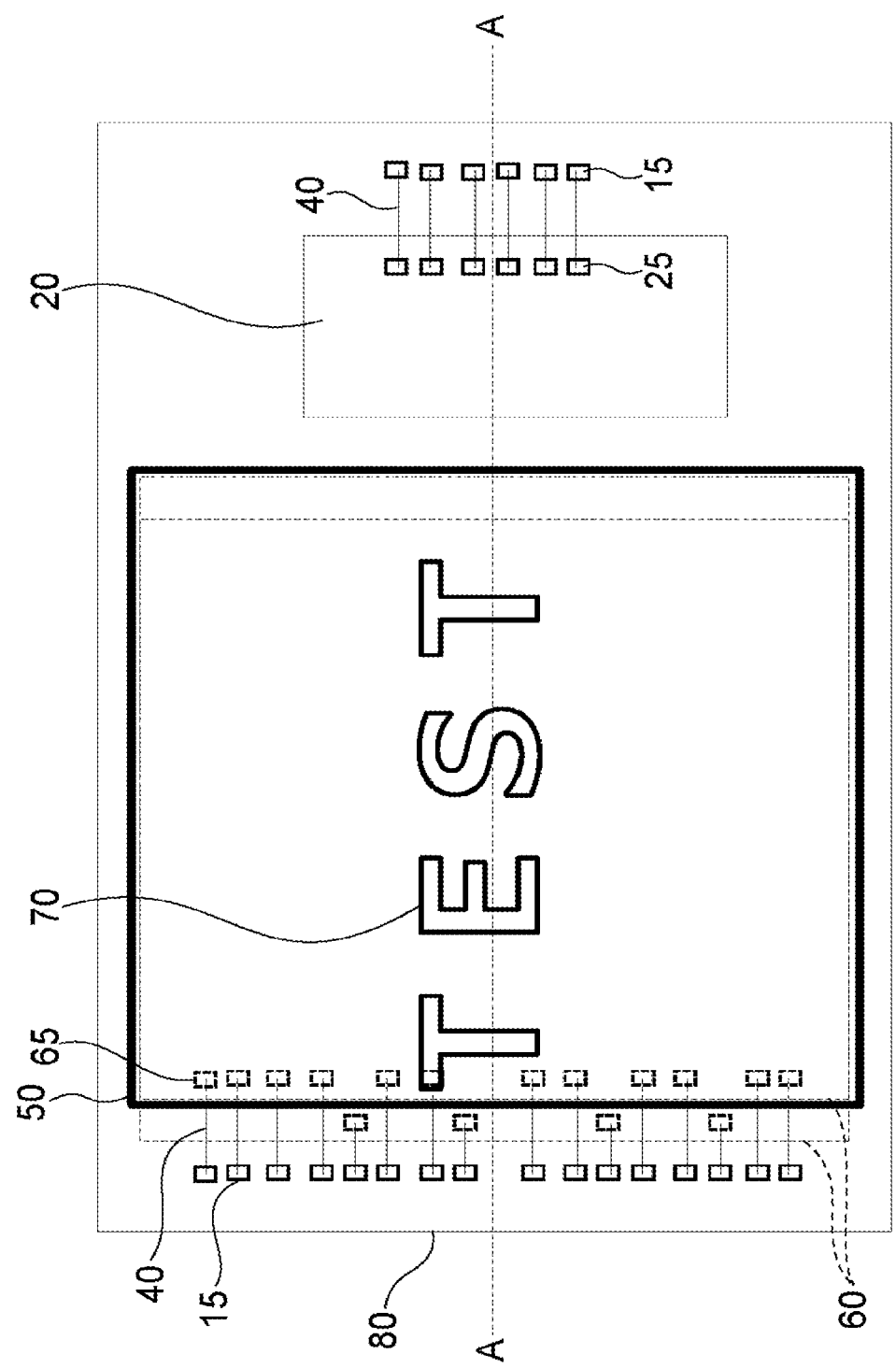
FIG. 10 is a plan view illustrating the configuration example of the semiconductor device according to the second modification of the first embodiment.

FIG. 9 is a sectional view illustrating a configuration example of the semiconductor device 1 according to a second modification of the first embodiment. FIG. 10 is a plan view illustrating the configuration example of the semiconductor device 1 according to the second modification of the first embodiment. For example, the planar shape of the dummy chip 50 has a substantially same area and a substantially same shape as those of the surface of the topmost memory chip 60a as illustrated in FIG. 10. Accordingly, the dummy chip 50 is provided to cover the memory chip 60a and to substantially overlap therewith in a planar view viewed from above the front surface F51.

For example, in a case in which the concave portions 70 are not engraved on the resin layer 80 on the metallic wires 40 connected to the topmost memory chip 60a, the dummy chip 50 does not need to be arranged above the metallic wires 40. In this case, it suffices that the dummy chip 50 covers only the memory chips 60 as in the second modification. This enables the memory chip 60a and the electrode pads 65 to be protected from damages due to the laser marking.

Second Embodiment

Figure 11A:
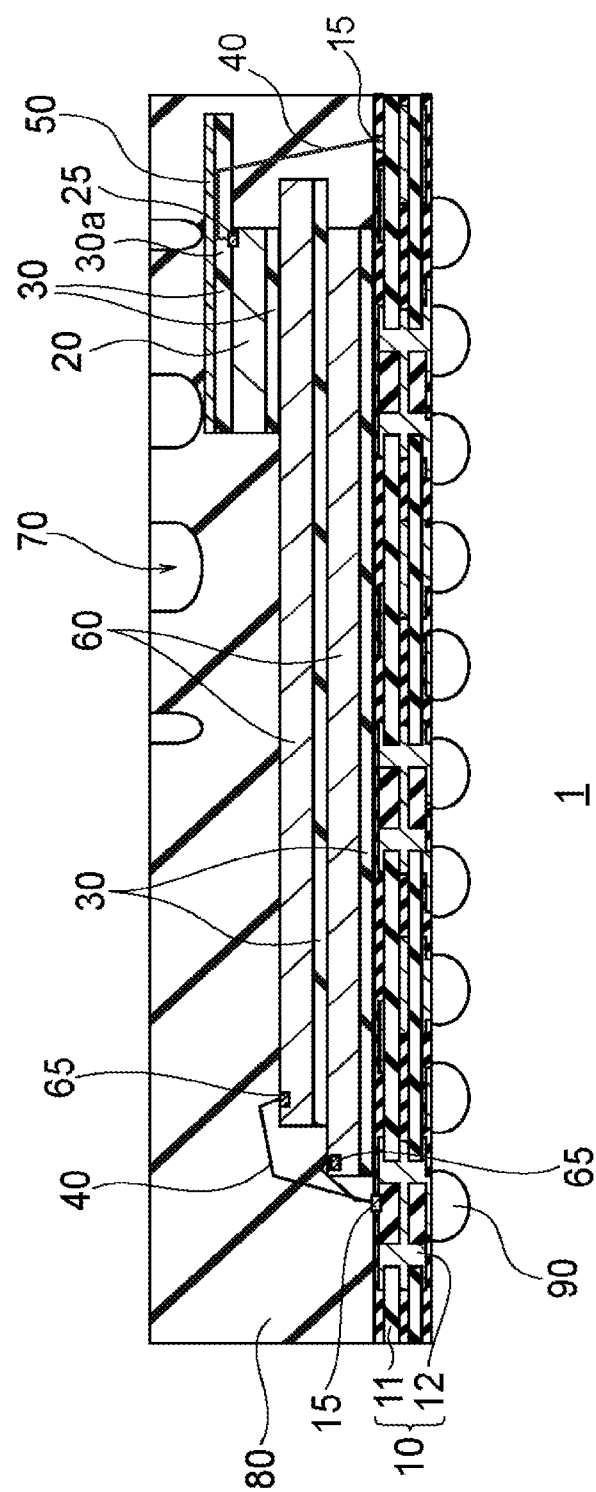
FIG. 11A is a sectional view illustrating a configuration example of a semiconductor device according to a second embodiment.
Figure 11B:
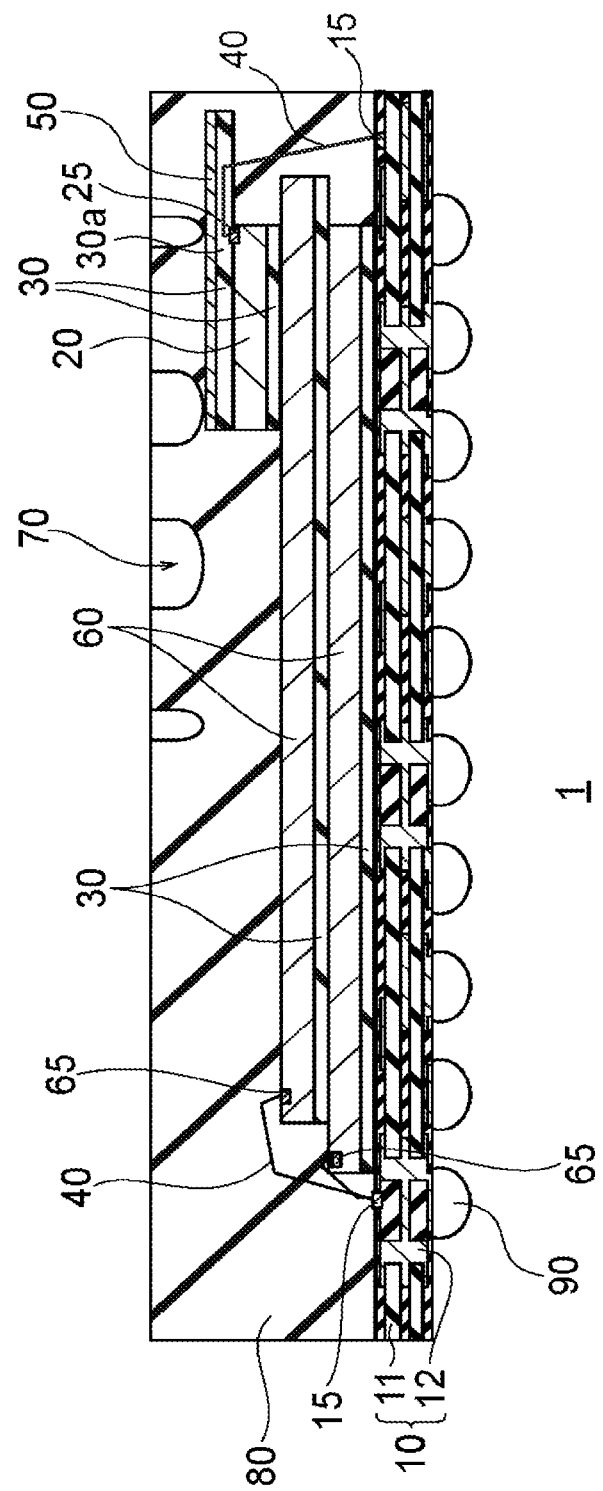
FIG. 11B is a sectional view illustrating the configuration example of the semiconductor device according to the second embodiment.
Figure 12:
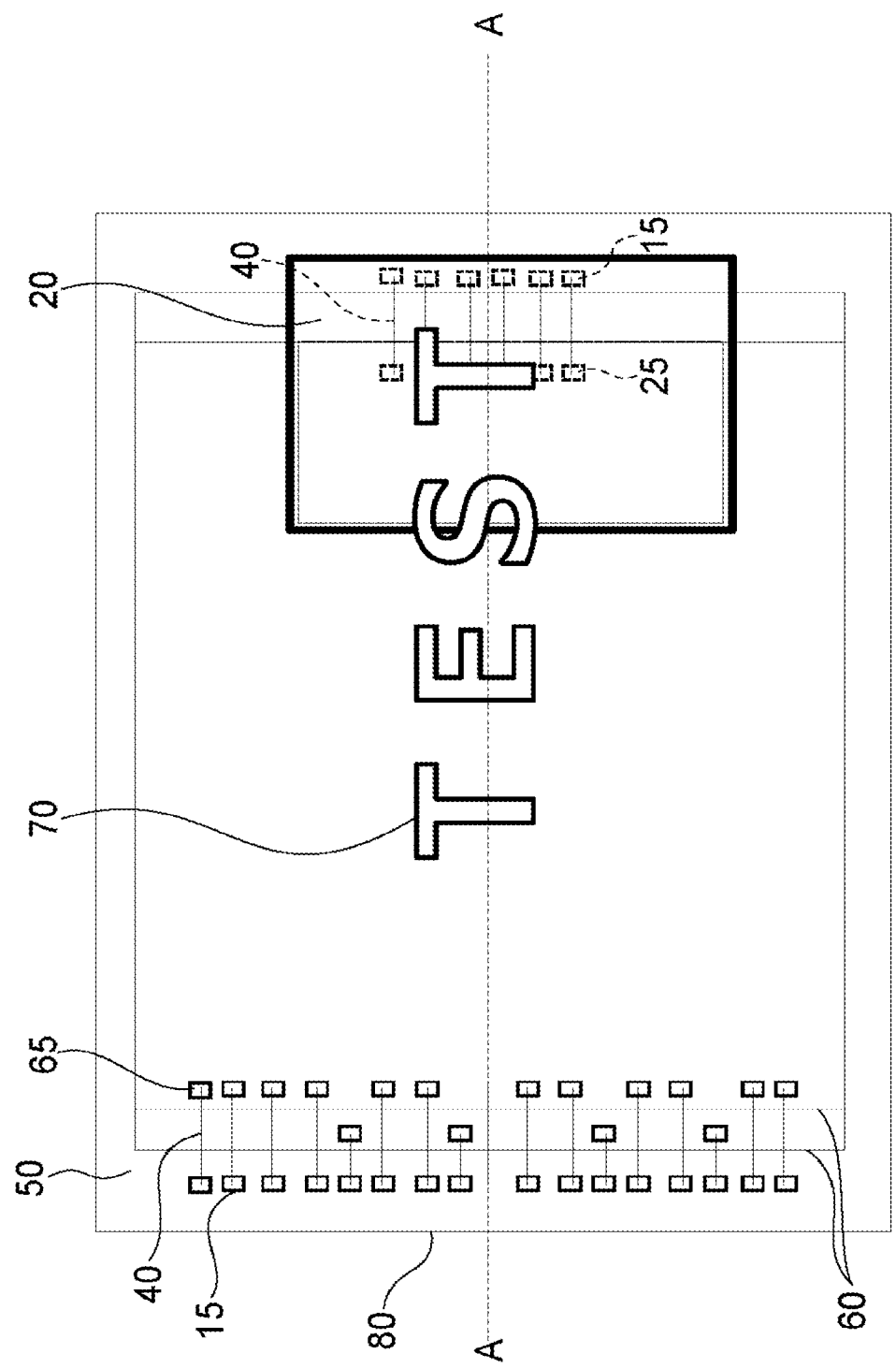
FIG. 12 is a plan view illustrating the configuration example of the semiconductor device according to the second embodiment.

FIGS. 11A and 11B are sectional views respectively illustrating a configuration example of the semiconductor device 1 according to a second embodiment. FIG. 12 is a plan view illustrating the configuration example of the semiconductor device 1 according to the second embodiment. Each of FIGS. 11A and 11B illustrates a cross-section along a line A-A in FIG. 12.

In the second embodiment, the controller chip 20 is stacked on a stacked body of the memory chips 60. The dummy chip 50 is provided on the controller chip 20. That is, a topmost semiconductor chip among the stacked semiconductor chips is the controller chip 20. In this case, a semiconductor chip likely to be damaged by the laser marking is the controller chip 20. Therefore, the dummy chip 50 is provided on the controller chip 20.

The configuration of the dummy chip 50 may be basically identical to that in the first embodiment. However, the planar shape of the dummy chip 50 and the size thereof are adapted to the controller chip 20 and may be different from those in the first embodiment.

The dummy chip 50 covers the entire surface of the controller chip 20 and protrudes from the top surface of the controller chip 20 to above the metallic wires 40 like eaves as illustrated in FIGS. 11A and 11B and FIG. 12. That is, the metallic wires 40 is located between the wiring substrate 10 and the dummy chip 50. The dummy chip 50 protrudes from at least an end portion of the controller chip 20 to which the metallic wires 40 are connected. For example, in a case in which the metallic wires 40 are connected to both ends of the controller chip 20, the dummy chip 50 is provided to protrude from the both ends of the controller chip 20 although not illustrated. In a case in which the metallic wires 40 are connected to all the four sides of the controller chip 20, the dummy chip 50 is provided to protrude from all the four sides of the controller chip 20. While not particularly limited to any shape, the planar shape of the dummy chip 50 is preferably a quadrangular shape or a polygonal shape having same numbers of sides and angles as those of the controller chip 20 to enable the dummy chip 50 to cover the controller chip 20 in the topmost layer in a planar view. With the dummy chip 50 covering the entire surface of the controller chip 20 in the topmost layer, damages on the controller chip 20 caused by the laser marking can be suppressed. Further, the dummy chip 50 protrudes from end portions of the memory chips 60 and is provided also above the metallic wires 40. Accordingly, influences of damages on the metallic wires 40 caused by the laser marking at the time of forming the concave portions 70 can be suppressed. The metallic wires 40 may extend through the adhesive layer 30 to be in contact with the back surface F52 of the dummy chip 50 as illustrated in FIG. 11A. Alternatively, the metallic wires 40 may remain in or under the adhesive layer 30 not to be in contact with the back surface F52 of the dummy chip 50 as illustrated in FIG. 11B. Further, the dummy chip 50 protrudes also to above the electrode pads 15 of the wiring substrate 10 and covers the electrode pads 15 in the planar view. This can suppress influences of damages on the electrode pads 15 caused by the laser marking.

Other configurations of the second embodiment may be identical to those of the first embodiment. Therefore, the second embodiment can achieve effects identical to those of the first embodiment.

A manufacturing method of the semiconductor device according to the second embodiment is explained next.

Figure 13:
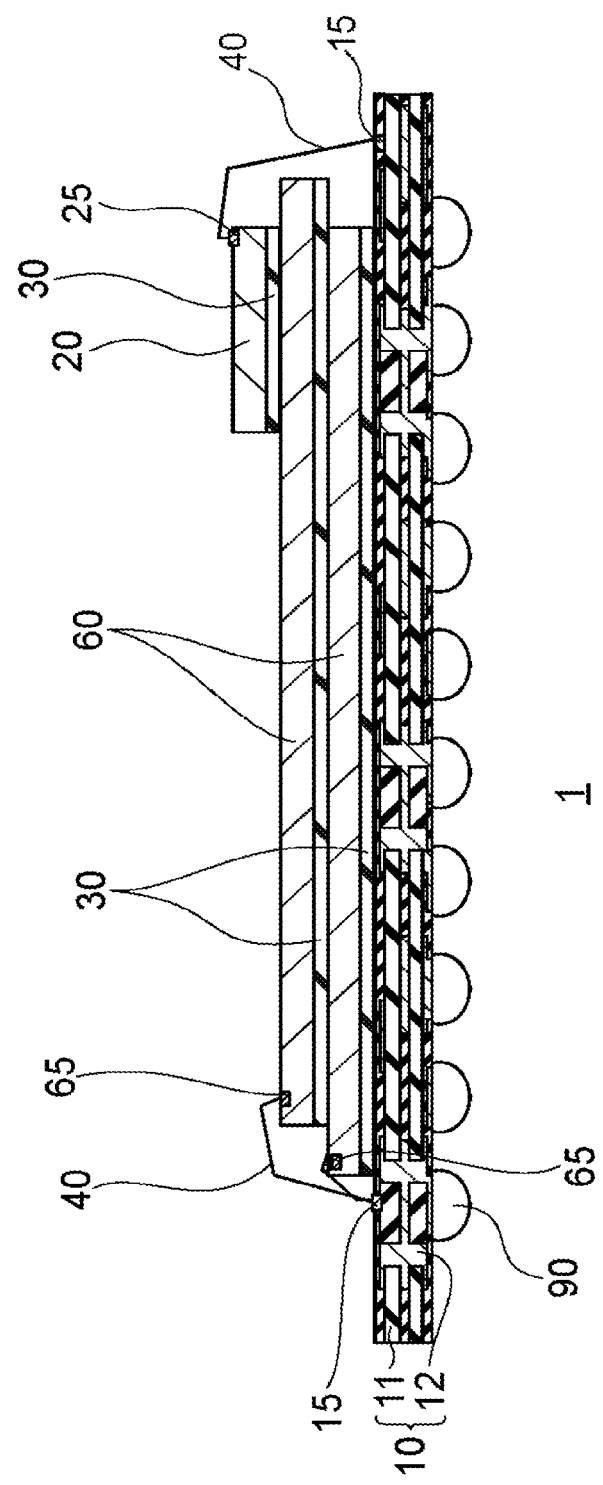
FIG. 13 is a sectional view illustrating an example of a manufacturing method of the semiconductor device according to the second embodiment.
Figure 14:
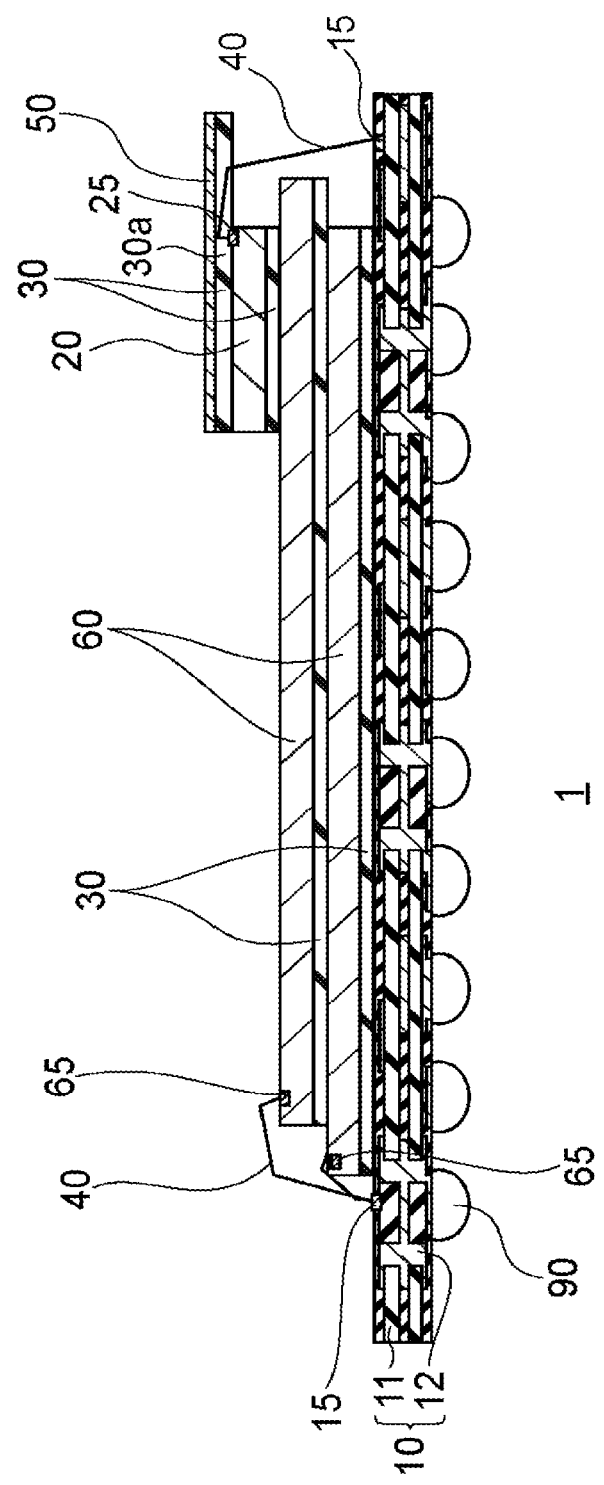
FIG. 14 is a sectional view illustrating an example of the manufacturing method of the semiconductor device following FIG. 13.
Figure 15:
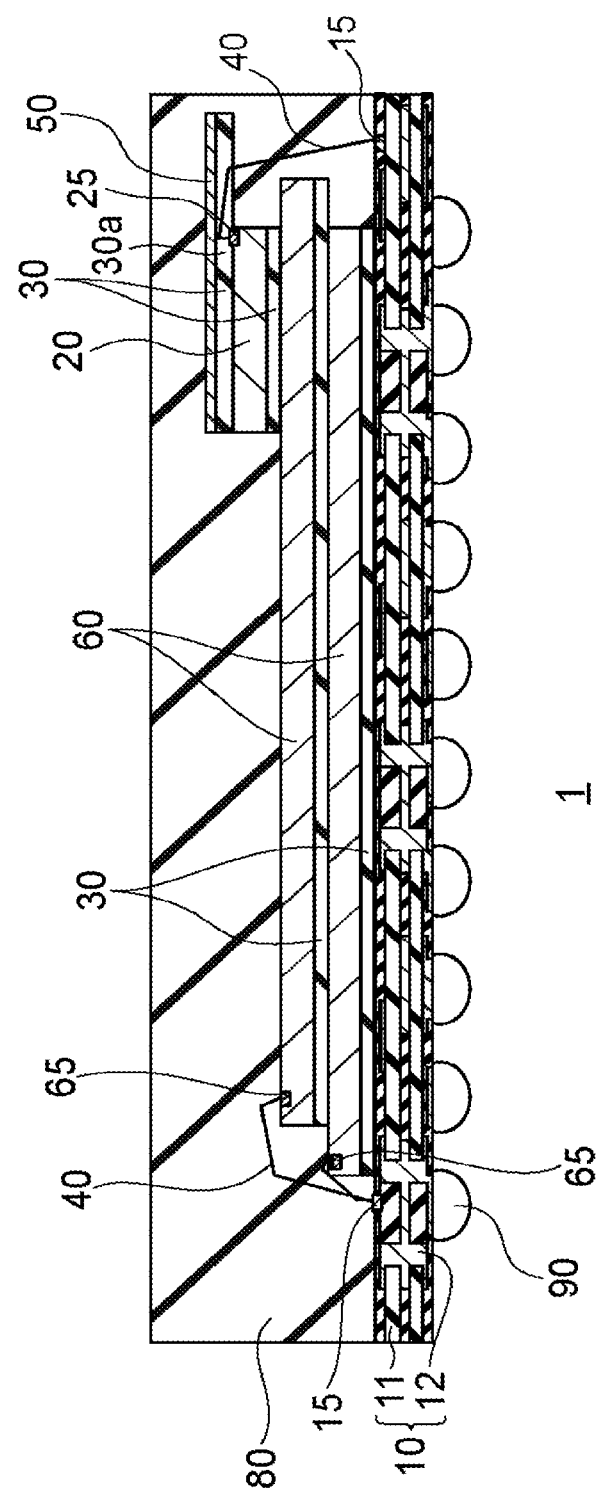
FIG. 15 is a sectional view illustrating an example of the manufacturing method of the semiconductor device following FIG. 14.

FIGS. 13 to 15 are sectional views illustrating an example of the manufacturing method of the semiconductor device according to the second embodiment.

First, the memory chips 60 and the controller chip 20 are formed similarly in the first embodiment.

Next, the adhesive layer 30 is attached to the back surfaces of the memory chips 60 to attach the memory chips 60 onto the wiring substrate 10 as illustrated in FIG. 13. While a single memory chip 60 may be attached onto the wiring substrate 10, a plurality of memory chips 60 may be staked on the wiring substrate 10. The number of stacked memory chips 60 is not particularly limited to any number.

Next, the adhesive layer 30 is attached to the back surface of the controller chip 20 to attach the controller chip 20 onto the memory chips 60.

Next, the electrode pads 25 on the top surface of the controller chip 20 and the electrode pads 65 on the top surfaces of the memory chips 60 are connected to the electrode pads 15 on the top surface of the wiring substrate 10 with the metallic wires 40. At this time, the metallic wires 40 connected to the controller chip 20 curve in the form of a loop and the apexes thereof are arranged at positions higher than the controller chip 20 in the topmost layer.

Subsequently, the adhesive layer 30a is attached to the back surface F52 of the dummy chip 50 to attach the dummy chip 50 onto the topmost controller chip 20 as illustrated in FIG. 14. At this time, the dummy chip 50 is attached to be arranged above the top surface of the topmost controller chip 20 and the metallic wires 40. The loops of the metallic wires 40 are restrained by the dummy chip 50 to be lower. At this time, the metallic wires 40 contacts with the adhesive layer 30a. Alternatively, a part of the metal wire 40 is covered with the adhesive layer 30a and contacts with the silicon oxide film 53 of the dummy chip 50. Therefore, adjacent ones of the metallic wires 40 do not short-circuit with each other.

Next, the controller chip 20, the dummy chip 50, the memory chips 60, and the metallic wires 40 are sealed with the resin layer 80 as illustrated in FIG. 15. Accordingly, the resin layer 80 can cover and protect the controller chip 20, the dummy chip 50, the memory chips 60, and the metallic wires 40. The thickness of the resin layer 80 on the dummy chip 50 is equal to or less than 50 micrometers.

Next, as illustrated in FIG. 11, the concave portions 70 are formed on the surface of the resin layer 80 by the laser marking method to engrave an identifier of the product. At this time, the controller chip 20 in the topmost layer and the metallic wires 40 are protected by the dummy chip 50. Therefore, damages caused by the laser marking hardly reach the controller chip 20 and the metallic wires 40. A sufficient thickness of the resin layer 80 is formed on the memory chips 60. Therefore, the damages caused by the laser marking also hardly reach the memory chips 60.

Thereafter, the wiring substrate 10 is diced by the blade dicing method or the laser dicing method to singulate the semiconductor devices 1. Packages of the semiconductor device 1 illustrated in FIG. 11 are thereby completed.

In this way, according to the second embodiment, damages on the controller chip 20 and the metallic wires 40 caused by the laser marking can be suppressed in a case in which the controller chip 20 is provided on the top step of a stacked body of the memory chips 60.

The dummy chip 50 may be caused to function as a heat spreader. With provision of the dummy chip 50, the effect of suppressing warpage of the package of the semiconductor device 1 is also obtained. To increase the effects of the heat spreader and the warpage suppression, it is preferable that the planar shape of the dummy chip 50 and the size thereof be close to the planar shape and the size of the package of the semiconductor device 1.

Further, the in the second embodiment, the first modification and the second modification can be combined with each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a wiring substrate having a wiring layer;
a first semiconductor chip provided above the wiring substrate;
a metallic wire connecting the first semiconductor chip and the wiring substrate to each other;
a silicon chip provided above the first semiconductor chip and covering above the metallic wire; and
a resin layer sealing the first semiconductor chip and the silicon chip, and the metallic wire, wherein
the silicon chip is insulated from the wiring substrate, and
the metallic wire is in direct contact with the silicon chip.

2. The device of claim 1, further comprising a second semiconductor chip between the first semiconductor chip and the wiring substrate, wherein
the first semiconductor chip and the second semiconductor chip are memory chips.

3. The device of claim 2, wherein the silicon chip is thinner than the first semiconductor chip.

4. The device of claim 2, wherein
the silicon chip comprises a first face and a second face on an opposite side to the first face, and
the silicon chip comprises a silicon dioxide film on a side of the second face, and the second face faces the wiring substrate.

5. The device of claim 2, wherein
the silicon chip comprises a first face and a second face on an opposite side to the first face, and
the device further comprises an insulating adhesive layer sticking the second face of the silicon chip to the first semiconductor chip.

6. The device of claim 1, further comprising a second semiconductor chip between the first semiconductor chip and the wiring substrate, wherein
the first semiconductor chip is a controller chip, and
the second semiconductor chip is a memory chip.

7. The device of claim 6, wherein the silicon chip is thinner than the first semiconductor chip.

8. The device of claim 6, wherein
the silicon chip comprises a first face and a second face on an opposite side to the first face, and
the silicon chip comprises a silicon dioxide film on a side of the second face, and the second face faces the wiring substrate.

9. The device of claim 1, wherein the silicon chip is a dummy chip.

10. The device of claim 9, wherein the silicon chip comprises no semiconductor element.

11. The device of claim 1, wherein the silicon chip is thinner than the first semiconductor chip.

12. The device of claim 1, wherein
the silicon chip comprises a first face and a second face on an opposite side to the first face, and
the silicon chip comprises a silicon dioxide film on a side of the second face, and the second face faces the wiring substrate.

13. The device of claim 1, wherein
the silicon chip comprises a first face and a second face on an opposite side to the first face, and
the device further comprises an insulating adhesive layer sticking the second face of the silicon chip to the first semiconductor chip.

14. The device of claim 13, wherein a part of the metallic wire is covered by the adhesive layer.

15. The device of claim 1, wherein the metallic wire is located between the wiring substrate and the silicon chip.

16. The device of claim 1, wherein
the wiring substrate comprises an electrode pad electrically connected to the wiring layer, and
the silicon chip covers the first semiconductor chip, the metallic wire connected to the first semiconductor chip, and the electrode pad to which the metallic wire is connected as viewed from above in a stacking direction of the first semiconductor chip and the silicon chip.

17. The device of claim 1, wherein a concave portion is provided on a front surface of the resin layer above the silicon chip.

* * * * *